(12) United States Patent
Park

(10) Patent No.: US 8,873,319 B2
(45) Date of Patent: Oct. 28, 2014

(54) ADDRESS OUTPUT CIRCUIT AND SEMICONDUCTOR MEMORY DEVICE

(75) Inventor: Sang Il Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 378 days.

(21) Appl. No.: 13/411,551

(22) Filed: Mar. 3, 2012

(65) Prior Publication Data

US 2013/0121097 A1 May 16, 2013

(30) Foreign Application Priority Data

Nov. 10, 2011 (KR) .......................... 10-2011-0117213

(51) Int. Cl.
G11C 7/00 (2006.01)
G11C 29/34 (2006.01)
G11C 29/00 (2006.01)
G11C 29/12 (2006.01)

(52) U.S. Cl.
CPC ........ *G11C 29/76* (2013.01); *G11C 2029/1202* (2013.01); *G11C 29/34* (2013.01)
USPC .. 365/200; 365/201; 365/230.01; 365/233.18

(58) Field of Classification Search
USPC ................... 365/200, 201, 230.01, 233.18
See application file for complete search history.

(56) References Cited

U.S. PATENT DOCUMENTS

2002/0176287 A1* 11/2002 Hur et al. .................... 365/200
2014/0082453 A1* 3/2014 Sikdar et al. .................. 714/763

FOREIGN PATENT DOCUMENTS

| KR | 1020020091766 A | 12/2002 |
| KR | 1020050089900 A | 9/2005 |
| KR | 1020100064158 A | 6/2010 |

* cited by examiner

*Primary Examiner* — Han Yang
(74) *Attorney, Agent, or Firm* — William Park & Associates Ltd.

(57) ABSTRACT

A semiconductor memory device includes a signal generation unit configured to generate a toggling signal and first and second pulse signals in response to a test signal and a burst pulse signal. An address output unit may be configured to receive first to fourth input addresses and output sequentially first to fourth output addresses in response to the toggling signal and the first and second pulse signals. A repair unit may be configured to perform a repair operation on a word line selected by the first to fourth output addresses.

20 Claims, 8 Drawing Sheets

ADDRESS OUTPUT CIRCUIT AND SEMICONDUCTOR MEMORY DEVICE

CROSS-REFERENCES TO RELATED APPLICATIONS

The present application claims priority under 35 U.S.C 119(a) to Korean Application No. 10-2011-0117213 filed on Nov. 10, 2011 in the Korean intellectual property Office, which is incorporated by reference in its entirety.

BACKGROUND

As semiconductor memory devices become more highly integrated with each advancement of the semiconductor memory device manufacturing process, it becomes highly likely that a failure occurs in circuitry of a semiconductor memory device. Since the semiconductor memory device with a failure cannot operate reliably, the semiconductor memory device needs to be discarded as a defective product, thereby reducing yield. Therefore, a semiconductor memory device includes extra redundancy cells so that a repair operation can replace a failed cell with a redundancy cell.

The repair operation of the semiconductor memory device will be described as follows.

First, a test is performed on cells in the semiconductor memory device to detect a fail address. The test may include a compression parallel test capable of determining whether any of a plurality of cells is defective. The compression parallel test is performed by sequentially selecting a plurality of word lines, storing data having the same logic level in a plurality of cells coupled to the word lines and then outputting at the same time the stored data, and comparing the logic levels of the data to detect a fail address.

Then, an address output circuit receives an input address including information of the fail address and outputs an output address in response to a pulse signal. A repair unit performs a repair operation on the word line selected by the output address.

Referring to FIG. 1, the relation between an input address and a pulse signal of a conventional semiconductor memory device will be described. In the following descriptions, it is assumed that a first input address INRA<1> is at a logic high level, a second input address INRA<2> is at a logic high level, a third input address INRA<3> is at a logic low level, and a fourth input address INRA<4> is at a logic high level.

First, a test signal TM is asserted to a logic high level to perform a compression parallel test. First to fourth pulse generation units sequentially generate first to fourth pulse signals PLS<1:4> from when a burst pulse signal BST is first generated. An address output circuit buffers the high-level first input address INRA<1> to output as a first output address OUTRA<1> in a period where the first pulse signal PLS<1> is at a logic high level, and buffers the high-level second input address INRA<2> to output as a second output address OUTRA<2> in a period where the second pulse signal PLS<2> is at a logic high level. Furthermore, the address output circuit buffers the low-level third input address INRA<3> to output as a third output address OUTRA<3> in a period where the third pulse signal PLS<3> is at a logic high level, and buffers the high-level fourth input address INRA<4> to output as a fourth output address OUTRA<4> in a period where the fourth pulse signal PLS<4> is at a logic high level.

The conventional semiconductor memory device generates the first to fourth pulse signals PLS<1:4> using four pulse generation units, receives the first to fourth input addresses INRA<1:4>, and outputs the first to fourth output addresses OUTRA<1:4> in response to the first to fourth pulse signals PLS<1:4>. As described above, in order to receive the first to fourth input addresses INRA<1:4> and output the first to fourth output addresses OUTRA<1:4>, four pulse signal generators are required. Furthermore, as the number of bits of the input address increases, the number of pulse signal generators also increases.

SUMMARY

An embodiment of the present invention relates to an address output circuit and a semiconductor memory device capable of reducing the number of pulse signal generators, thereby reducing the area of the layout.

In one embodiment, a semiconductor memory device includes a signal generation unit configured to generate a toggling signal and first and second pulse signals in response to a test signal and a burst pulse signal. An address output unit may be configured to receive first to fourth input addresses and sequentially output first to fourth output addresses in response to the toggling signal and the first and second pulse signals. A repair unit configured to perform a repair operation on a word line selected by the first to fourth output addresses.

In another embodiment, an address output circuit includes a first pulse signal generation unit configured to generate a first pulse signal in response to a reset signal and a toggling signal which toggles whenever a burst pulse signal is generated, in a period where a test signal is asserted. A second pulse signal generation unit may be configured to shift the first pulse signal and generate a second pulse signal in response to the togging signal and the reset signal. An address output unit may be configured to receive first to fourth input addresses, and sequentially output first to fourth output addresses in response to the toggling signal and the first and second pulse signals.

BRIEF DESCRIPTION OF THE DRAWINGS

The above and other aspects, features, and advantages will be more clearly understood from the following detailed description taken in conjunction with the accompanying drawings.

DESCRIPTION OF SPECIFIC EMBODIMENTS

Various embodiments of the present invention will be described with reference to accompanying drawings. However, the embodiments are for illustrative purposes only and are not intended to limit the scope of the invention.

Figure 1:
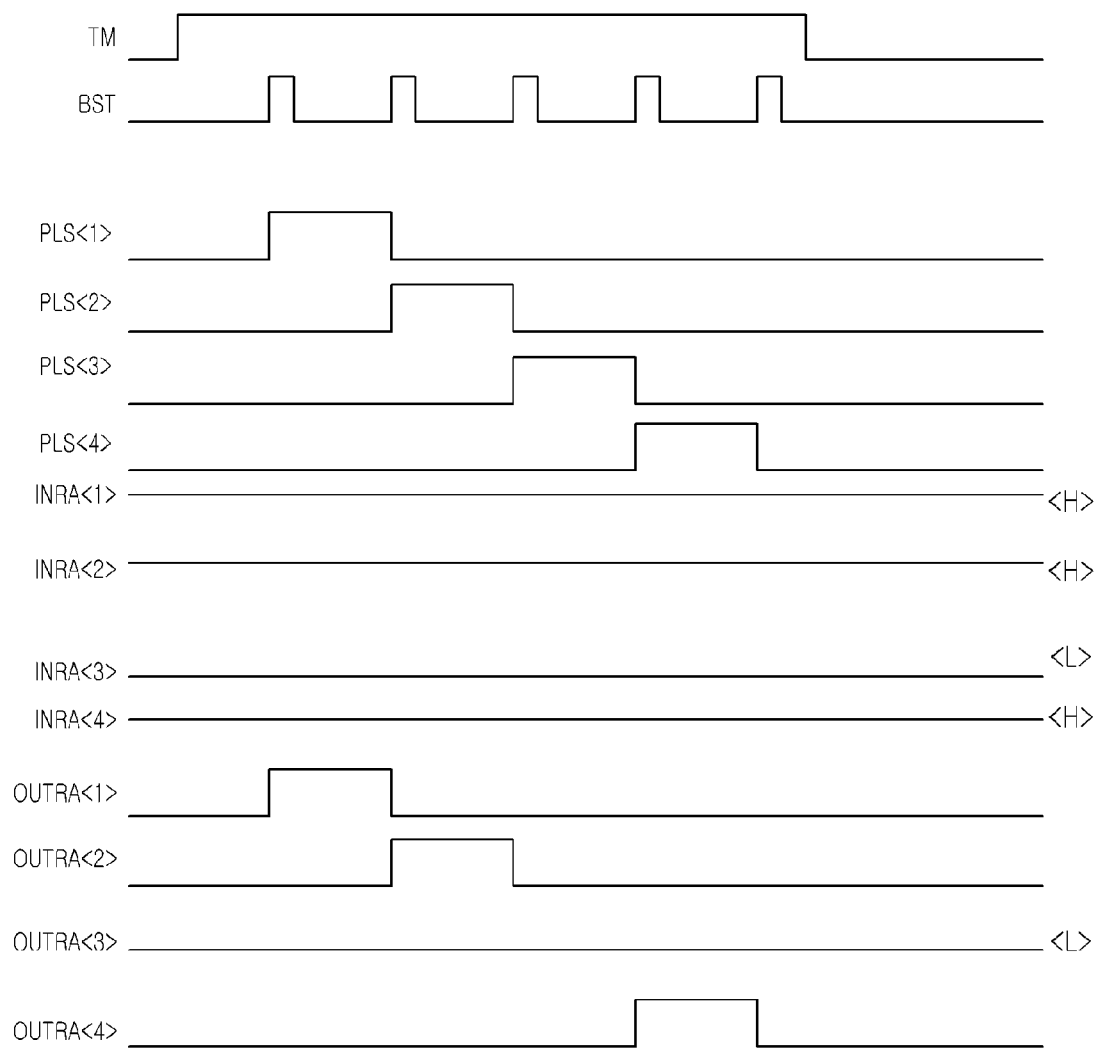
FIG. 1 is a timing diagram explaining the operation of a conventional semiconductor memory device.
Figure 2:
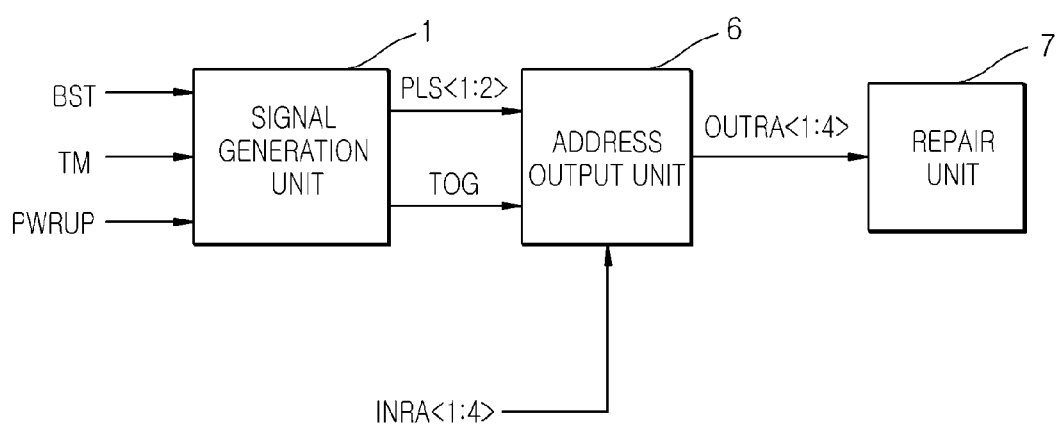
FIG. 2 is a block diagram illustrating an exemplary configuration of a semiconductor memory device in accordance with an embodiment of the present invention.

FIG. 2 is a block diagram illustrating the configuration of a semiconductor memory device in accordance with an embodiment of the present invention.

Referring to FIG. 2, the semiconductor memory device in accordance with an embodiment of the present invention includes a signal generation unit 1, an address output unit 6, and a repair unit 7. The signal generation unit 1 generates a toggling signal TOG which toggles whenever a burst pulse signal BST is generated during a period when a test signal TM is asserted. Here, the test signal TM is a signal asserted to a logic high level when a compression parallel test is to be performed. Furthermore, the signal generation unit 1 is configured to generate a first pulse signal PLS<1> including a pulse signal which is asserted to a logic high level during one cycle of the toggling signal TOG when a power-up signal PWRUP is asserted. Furthermore, the signal generation unit 1 is configured to shift the first pulse signal PLS<1> by one cycle of the toggling signal TOG and generate a second pulse signal PLS<2>. The address output unit 6 is configured to buffer a first input address INRA<1> to output as a first output address OUTRA<1> when the first pulse signal PLS<1> and the toggling signal TOG are at a logic high level, and buffer a second input address INRA<2> to output as a second output address OUTRA<2> when the first pulse signal PLS<1> and an inverted toggling signal TOGB are at a logic high level. Furthermore, the output address unit 6 is configured to buffer a third input address INRA<3> to output as a third output address OUTRA<3> when the second pulse signal PLS<2> and the toggling signal TOG are at a logic high level, and buffer a fourth input address INRA<4> to output as a fourth output address OUTRA<4> when the second pulse signal PLS<2> and the inverted toggling signal TOG are at a logic high level. The repair unit 7 is configured to perform a repair operation on a word line selected by the first to fourth output addresses.

Figure 3:
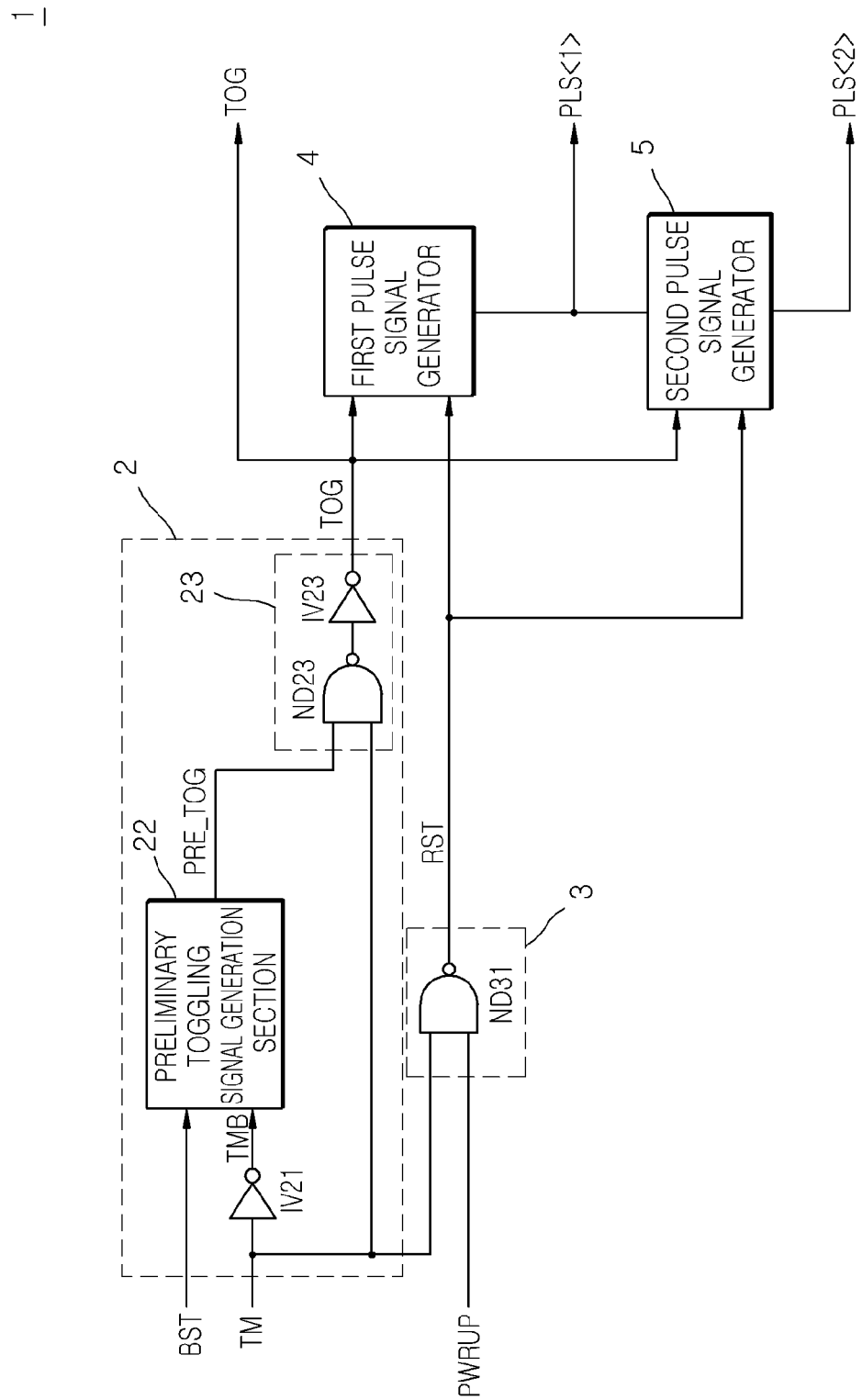
FIG. 3 is a block diagram of an exemplary signal generation unit included in the semiconductor memory device of FIG. 2.

Referring to FIG. 3, the signal generation unit 1 includes a toggling signal generator 2, a reset signal generator 3, a first pulse signal generator 4, and a second pulse signal generator 5.

The toggling signal generator 2 includes an inverter IV21, a preliminary toggling signal generation section 22, and a buffer section 23. The toggling signal generator 2 is configured to generate the toggling signal TOG which toggles whenever the burst pulse signal BST is generated, in a period where the test signal TM is asserted.

Figure 4:
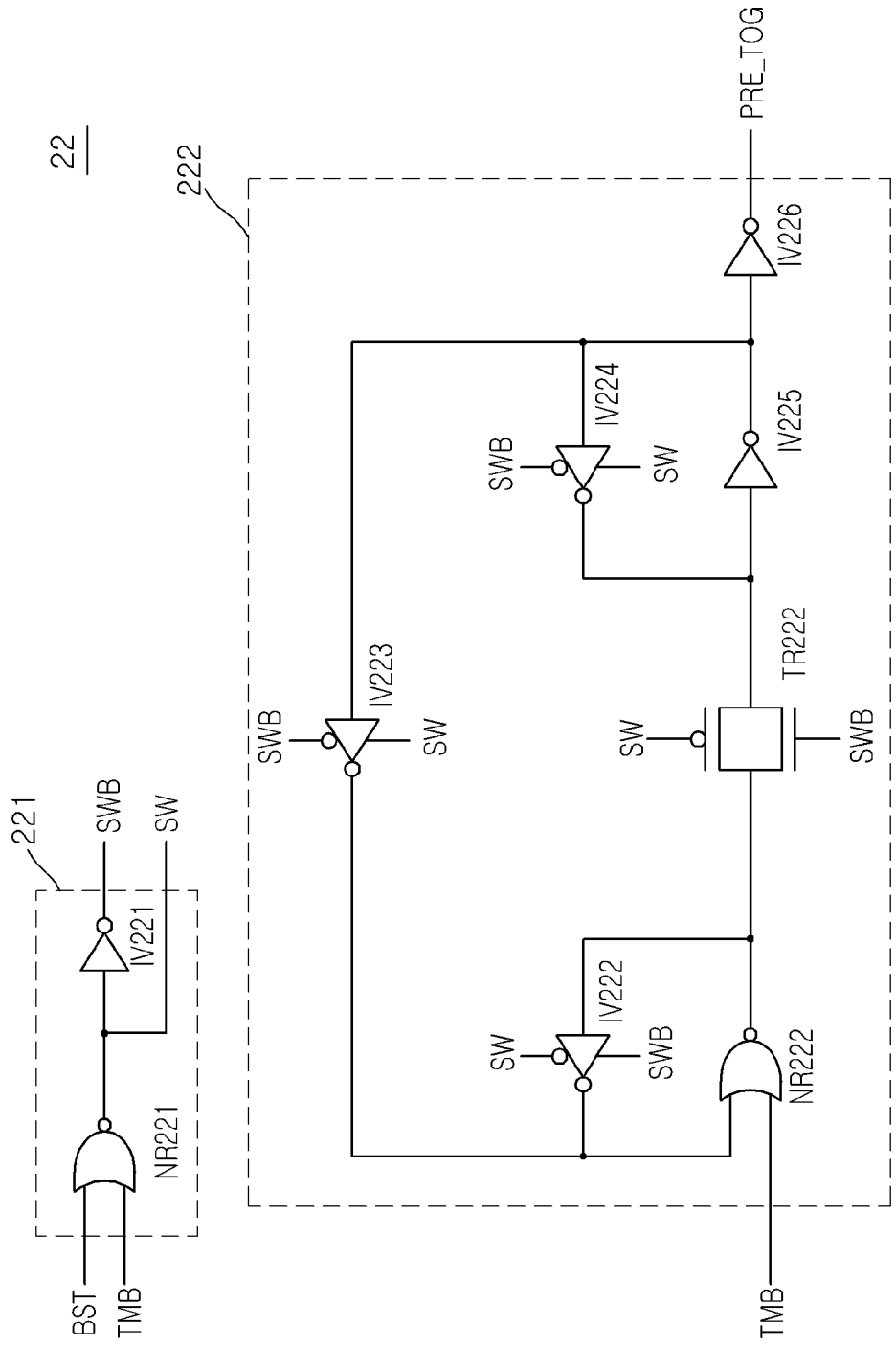
FIG. 4 is a circuit diagram of an exemplary preliminary toggling signal generator included in the signal generation unit of FIG. 3.

Referring to FIG. 4, the preliminary toggling signal generation section 22 includes a switching signal generation section 221 and a preliminary toggling signal output section 222. The switching signal generation section 221 includes a NOR gate NR221 and an inverter IV221, and the preliminary toggling signal output section 222 includes a NOR gate NR222, a transmission gate TR222, and five inverters IV222 to IV226. The preliminary toggling signal generation section 22 is configured to generate a preliminary toggling signal PRE_TOG which toggles whenever the burst pulse signal BST is generated, during the period when the test signal TM is asserted. The buffer section 23 includes a NAND gate ND23 and an inverter IV23, and is configured to buffer the preliminary toggling signal PRE_TOG and generate the toggling signal TOG during the period when the test signal TM is asserted.

The reset signal generator 3 includes a NAND gate ND31 and is configured to perform a NAND operation on the test signal TM and the power-up period PWRUP and generate a reset signal RST. The reset signal generator 3 generates the reset signal RST which is asserted to a logic low level when both the test signal TM and the power-up signal PWRUP are at a logic high level. Here, the power-up signal PWRUP is a signal which is asserted to a logic high level after a power-up period when an applied external voltage approaches a preset level.

Figure 5:
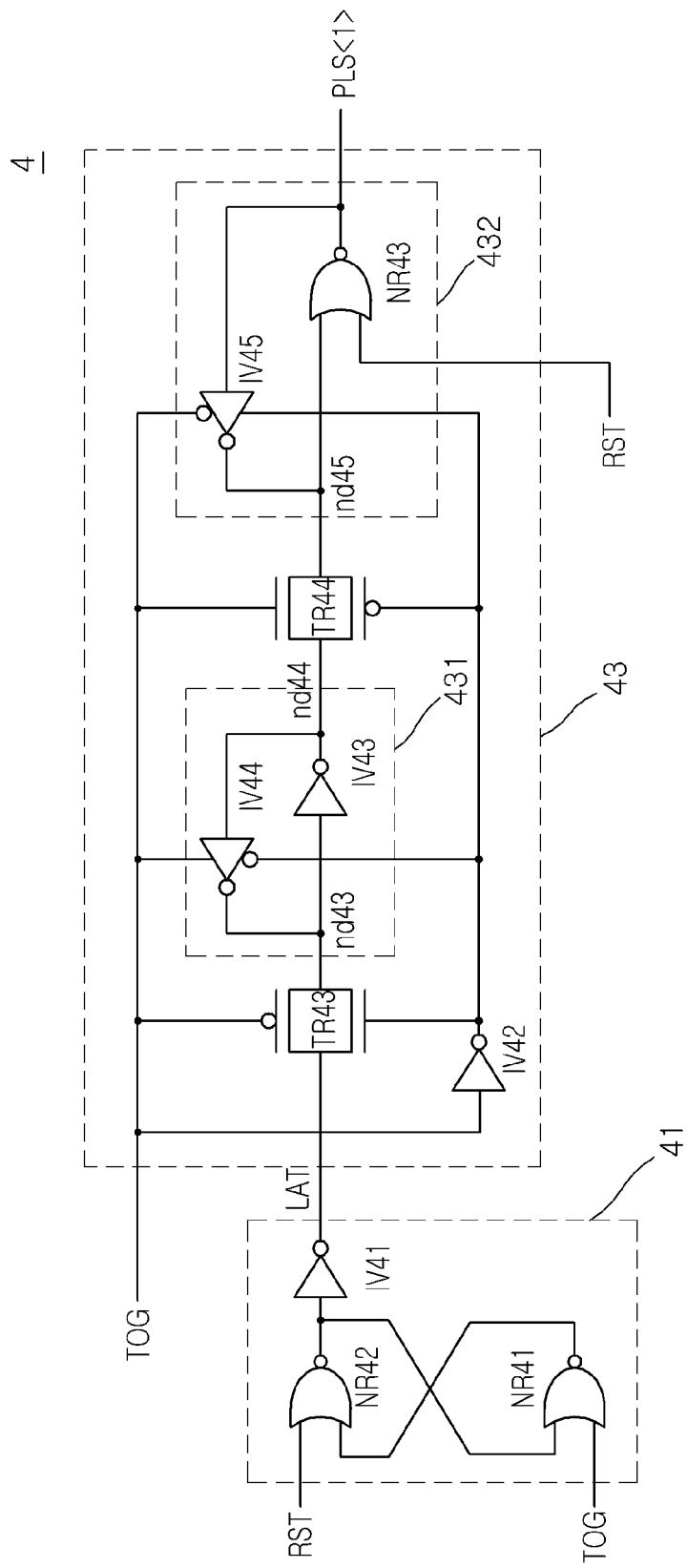
FIG. 5 is a circuit diagram of an exemplary first pulse signal generator included in the signal generation unit of FIG. 3.

Referring to FIG. 5, the first pulse signal generator 4 includes an RS latch section 41 and a pulse signal output section 43.

The RS latch section 41 includes two NOR gates NR41 and NR42 and one inverter IV41. The RS latch section 41 is configured to receive the reset signal RST and the toggling signal TOG and generate a latch signal LAT which changes from a logic high level to a logic low level when the toggling signal TOG first toggles.

The first pulse signal output section 43 includes two transmission gates TR43 and TR44, one inverter IV42, a first latch section 431, and a second latch section 432. The transmission gate TR43 is configured to transmit the latch signal LAT to a node nd43 when the toggling signal TOG is at a logic low level. The first latch section 431 includes two inverters IV43 and IV44, and is configured to latch a signal of the node nd43 and output the latched signal to a node nd44 when the toggling signal TOG is at a logic high level. The transmission gate TR44 is configured to transmit a signal of the node nd44 to a node nd45 when the toggling signal TOG is at a logic high level. The second latch section 432 includes a NOR gate NR431 and an inverter IV45, and is configured to latch a signal of the node nd45 and output the latched signal as the first pulse signal PLS<1>, when the toggling signal TOG is at a logic low level during a period when the reset signal RST is asserted to a logic low level.

The first pulse signal generator 4 configured in such a manner generates the first pulse signal PLS<1> asserted to a logic high level during one cycle of the toggling signal TOG from when the toggling signal first toggles in the period where the reset signal RST is asserted.

Figure 6:
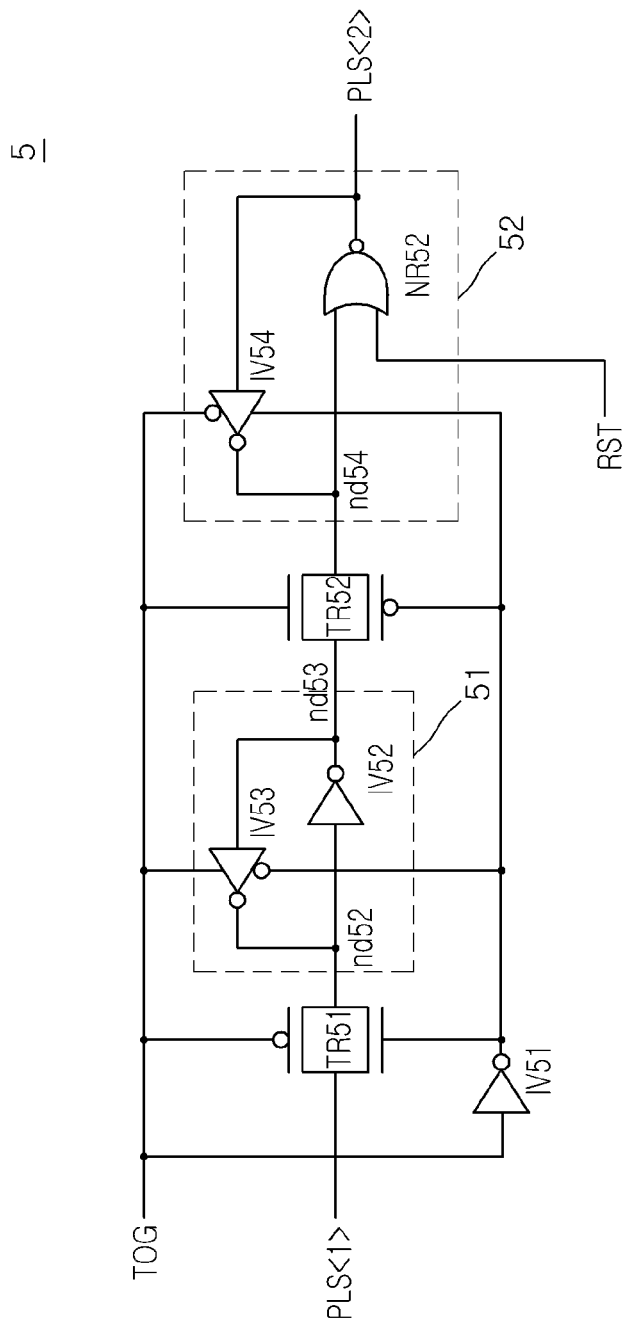
FIG. 6 is a circuit diagram of an exemplary second pulse signal generator included in the signal generation unit of FIG. 3.

Referring to FIG. 6, the second pulse signal generator 5 includes two transmission gates TR51 and TR52, one inverter IV51, a third latch section 51, and a fourth latch section 52.

The transmission gate TR51 is configured to transmit the first pulse signal PLS<1> to a node nd52 when the toggling signal TOG is at a logic low level. The third latch section 51 includes two inverters IV52 and IV53, and is configured to latch a signal of the node nd52 and output the latched signal to a node nd53 when the toggling signal TOG is at a logic low level. The transmission gate TR52 is configured to transmit a signal of the node nd53 to a node nd54 when the toggling signal TOG is at a logic high level. The second latch section 432 includes a NOR gate NR51 and an inverter IV54, and is configured to latch a signal of the node nd54 and output the latched signal as the second pulse signal PLS<2> when the toggling signal TOG is at a logic low level in the period where the reset signal RST is at a logic low level.

The second pulse signal generator 5 configured in such a manner generates the second pulse signal PLS<2> by shifting the first pulse signal PLS<1> by one cycle of the toggling signal TOG in the period where the reset signal RST is asserted.

Figure 7:
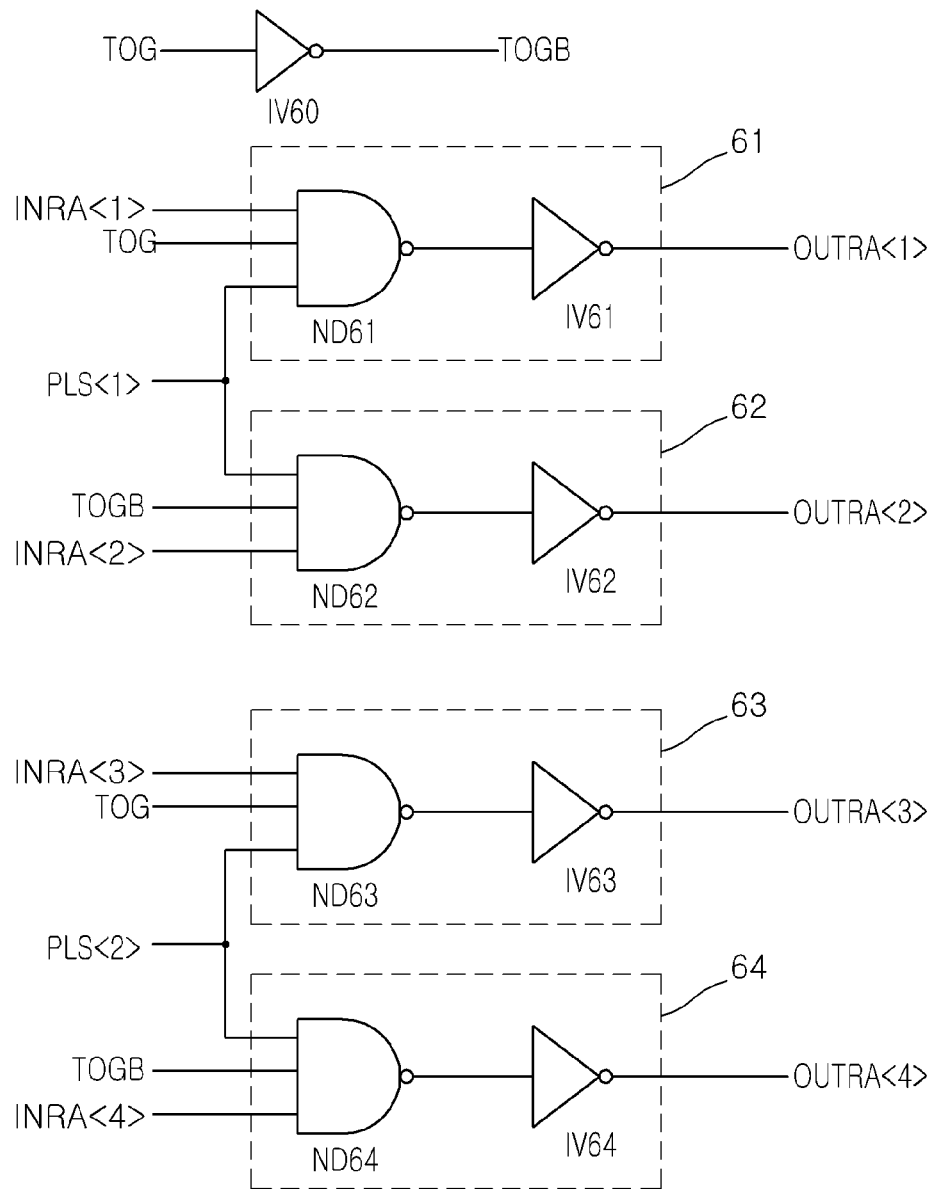
FIG. 7 is a circuit diagram of an exemplary address output unit included in the semiconductor memory device of FIG. 2.

Referring to FIG. 7, the address output unit 6 includes an inverter IV60, a first output section 61, a second output section 62, a third output section 63, and a fourth output section 64.

The inverter IV60 is configured to invert and buffer the toggling signal TOG and generate an inverted toggling signal TOGB.

The first output section 61 includes a three-input NAND gate ND61 and an inverter IV61, and is configured to buffer the first input address INRA<1> and output the buffered signal as the first output address OUTRA<1> in a period where the first pulse signal PLS<1> and the toggling signal TOG are at a logic high level.

The second output section 62 includes a three-input NAND gate ND62 and an inverter IV62, and is configured to buffer the second input address INRA<2> and output the buffered signal as the second output address OUTRA<2> in a period where the first pulse signal PLS<1> and the inverted toggling signal TOGB are at a logic high level.

The third output section 63 includes a three-input NAND gate ND63 and an inverter IV63, and is configured to buffer the third input address INRA<3> and output the buffered signal as the third output address OUTRA<3> in a period where the second pulse PLS<2> and the toggling signal TOG are at a logic high level.

The fourth output section 64 includes a three-input NAND gate ND64 and an inverter IV64, and is configured to buffer the fourth output address INRA<4> and output the buffered signal as the fourth output address OUTRA<4> in a period where the second pulse PLS<2> and the inverted toggling signal TOGB are at a logic high level.

The address output unit 6 configured in such a manner buffers the first input address INRA<1> to output as the first output address OUTRA<1> in the period where the first pulse signal PLS<1> and the toggling signal TOG are asserted to a logic high level, and buffers the second input address INRA<2> to output as the second output address OUTRA<2> in the period where the first pulse signal PLS<1> and the inverted toggling signal TOGB are asserted to a logic high level. Furthermore, the address output unit 6 buffers the third input address INRA<3> to output as the third output address OUTRA<3> in the period where the second pulse signal PLS<2> and the toggling signal TOG are asserted to a logic high level, and buffers the fourth input address INRA<4> to output as the fourth output address OUTRA<4> in the period where the second pulse signal PLS<2> and the inverted toggling signal TOGB are asserted to a logic high level.

The repair unit 7 performs a repair operation on a word line selected by the first to fourth output addresses.

Figure 8:
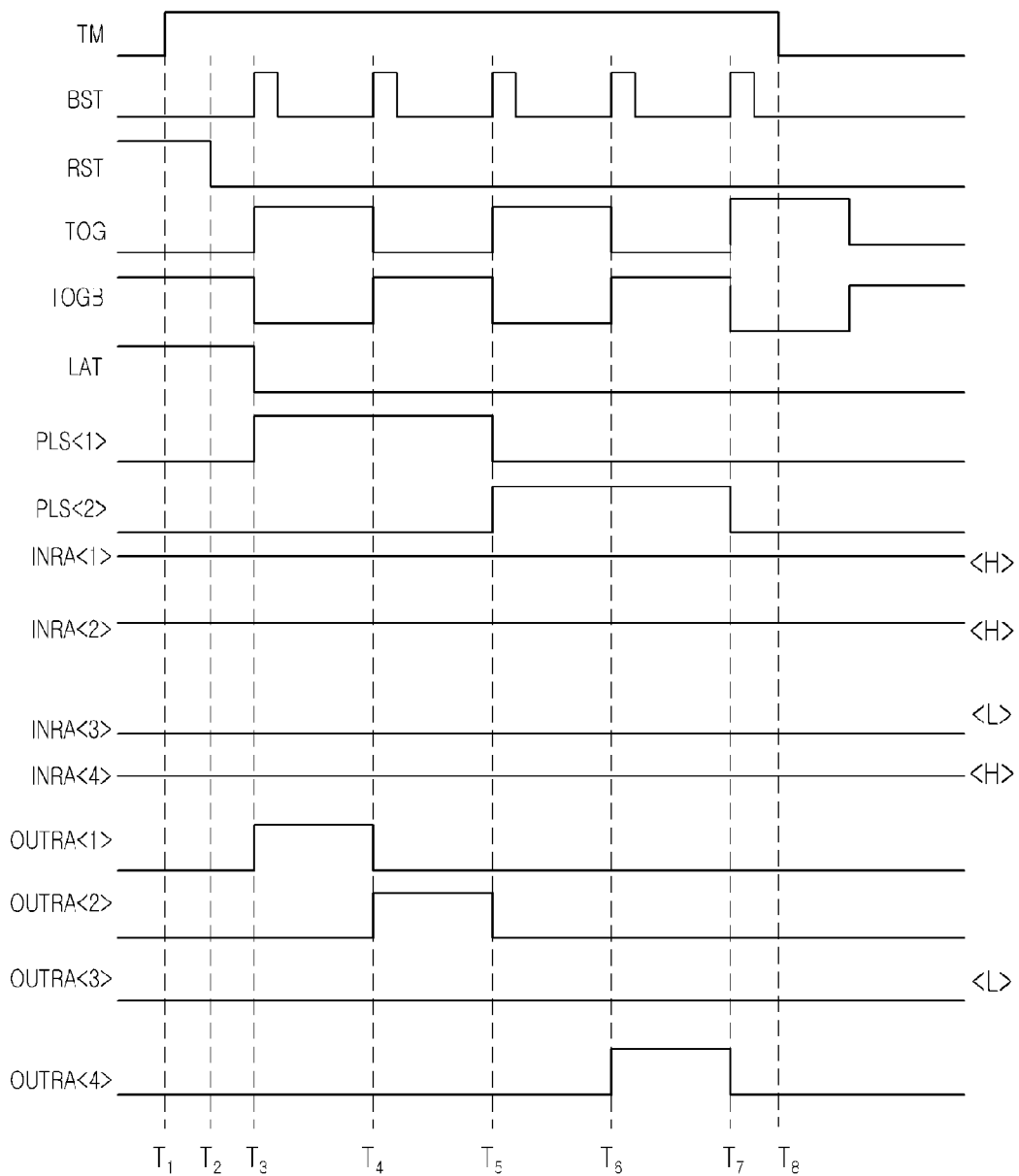
FIG. 8 is a timing diagram explaining an exemplary operation of the semiconductor memory device in accordance with an embodiment of the present invention.

Referring to FIG. 8, the operation of the semiconductor memory device configured in such a manner will be described. In the following descriptions, it is assumed that the first input address INRA<1> is at a logic high level, the second input address INRA<2> is at a logic high level, the third input address INRA<3> is at a logic low level, and the fourth input address INRA<4> is at a logic high level.

First, at a time point T1, the test signal TM is asserted to a logic high level to perform a compression parallel test. At a time point T2, since the power-up signal PWRUP changes to a logic high level, the reset signal generator 3 asserts the reset signal RST to a logic low level. At a time point T3, the burst pulse signal BST having a constant period is generated.

The toggling signal generator 2 generates the toggling signal TOG which toggles whenever the burst pulse signal BST is generated, in the period where the test signal TM is asserted.

The reset signal generator 3 generates the reset signal RST which is asserted to a logic low level when both the test signal TM and the power-up signal PWRUP are at a logic high level.

The first pulse signal generator 4 generates the first pulse signal PLS<1> during one cycle of the toggling signal TOG when the toggling signal TOG is first asserted and the reset signal RST is asserted.

The second pulse generator 5 generates the second pulse signal PLS<2> by shifting the first pulse signal PLS<1> by one cycle of the toggling signal TOG.

The address output unit 6 buffers the high-level first input address INRA<1> and outputs the buffered signal as the first output address OUTRA<1> in a period T3~T4 where the first pulse signal PLS<1> and the toggling signal TOG are asserted to a logic high level. The address output unit 6 buffers the high-level second input address INRA<2> and outputs the buffered signal as the second output address OUTRA<2> in a period T4~T5 where the first pulse signal PLS<1> and the inverted toggling signal TOGB are asserted to a logic high level. Furthermore, the address output unit 6 buffers the high-level third input address INRA<3> and outputs the buffered signal as the third output address OUTRA<3> in a period T5~T6 where the second pulse signal PLS<2> and the toggling signal TOG are asserted to a logic high level. The address output unit 6 buffers the high-level fourth input address INRA<4> and outputs the buffered signal as the fourth output address OUTRA<4> in a period T6~T7 where the second pulse signal PLS<2> and the inverted toggling signal TOGB are asserted to a logic high level.

The repair unit 7 performs a repair operation on a word line selected by the first to fourth output addresses.

As described above, the semiconductor memory device in accordance with an embodiment of the present invention buffers the first to fourth input addresses INRA<1:4> to output as the first to fourth output addresses OUTRA<1:4> in response to the toggling signal TOG when the appropriate first or second pulse signal PLS<1:2> is asserted. Therefore, since the number of pulse signal generators is reduced, it is possible to reduce the area of the layout.

In accordance with an embodiment of the present invention, the semiconductor memory device outputs two output addresses in response to a pulse signal outputted from one pulse signal generator and a toggling signal. Therefore, since the number of pulse signal generators is reduced, it is possible to reduce the area of the layout.

The embodiments of the present invention have been disclosed above for illustrative purposes. Those skilled in the art will appreciate that various modifications, additions, and substitutions are possible without departing from the scope and spirit of the invention as disclosed in the accompanying claims.

What is claimed is:

1. A semiconductor memory device comprising:
a signal generation unit configured to generate a toggling signal and first and second pulse signals in response to a test signal and a burst pulse signal;
an address output unit configured to receive first to fourth input addresses and sequentially output first to fourth output addresses in response to the toggling signal and the first and second pulse signals; and
a repair unit configured to perform a repair operation on a word line selected by the first to fourth output addresses.

2. The semiconductor memory device of claim 1, wherein the first to fourth input addresses comprise information of a fail address determined by a compression parallel test.

3. The semiconductor memory device of claim 1, wherein the signal generation unit comprises:
a toggling signal generator configured to generate the toggling signal in response to the test signal and the burst pulse signal;
a reset signal generator configured to generate a reset signal in response to the test signal and a power-up signal;

a first pulse signal generator configured to generate the first pulse signal in response to the toggling signal and the reset signal; and a second pulse signal generator configured to shift the first pulse signal and generate the second pulse signal in response to the toggling signal and the reset signal.

4. The semiconductor memory device of claim 3, wherein the toggling signal generator generates the toggling signal which toggles whenever the burst pulse signal is generated, in a period where the test signal is asserted.

5. The semiconductor memory device of claim 3, wherein the togging signal generator comprises:

an inverter configured to invert and buffer the test signal and generate an inverted test signal;

a preliminary toggling signal generation section configured to generate a preliminary toggling signal in response to the inverted test signal and the burst pulse signal; and a buffer section configured to generate the toggling signal in response to the test signal and the preliminary togging signal.

6. The semiconductor memory device of claim 5, wherein the preliminary toggling signal generation section comprises:

a switching signal generation section configured to perform a logic operation on the inverted test signal and the burst pulse signal to generate a switching signal; and a preliminary toggling signal output section configured to receive the inverted test signal and output the preliminary togging signal in response to the switching signal.

7. The semiconductor memory device of claim 3, wherein the first pulse signal generator generates the first pulse signal which is asserted during one cycle of the toggling signal.

8. The semiconductor memory device of claim 3, wherein the first pulse signal generator comprises:

a latch section configured to generate a latch signal in response to the toggling signal and the reset signal; and a first pulse signal output section configured to receive the latch signal and output the first pulse signal in response to the togging signal and the reset signal.

9. The semiconductor memory device of claim 3, wherein the second pulse signal generator generates the second pulse signal by shifting the first pulse signal by one cycle of the toggling signal.

10. The semiconductor memory device of claim 1, wherein the address output unit receives the first to fourth input addresses, and sequentially outputs the first to fourth output addresses in response to the toggling signal and the first and second pulse signals.

11. The semiconductor memory device of claim 1, wherein the address output unit comprises:

an inverter configured to invert and buffer the toggling signal and generate an inverted toggling signal;

a first address output section configured to buffer the first input address and output the buffered first input address as the first output address in response to the toggling signal and the first pulse signal;

a second address output section configured to buffer the second input address and output the buffered second input address as the second output address in response to the inverted toggling signal and the first pulse signal;

a third address output section configured to buffer the third input address and output the buffered third input address as the third output address in response to the toggling signal and the second pulse signal; and a fourth address output section configured to buffer the fourth input address and output the buffered fourth input address as the fourth output address in response to the inverted toggling signal and the second pulse signal.

12. An address output circuit comprising:

a first pulse signal generation unit configured to generate a first pulse signal in response to a reset signal and a toggling signal which toggles whenever a burst pulse signal is generated, in a period where a test signal is asserted;

a second pulse signal generation unit configured to shift the first pulse signal and generate a second pulse signal in response to the togging signal and the reset signal; and an address output unit configured to receive first to fourth input addresses, and sequentially output first to fourth output addresses in response to the toggling signal and the first and second pulse signals.

13. The address output circuit of claim 12, wherein the first pulse signal generation unit generates the first pulse signal which is asserted during one cycle of the toggling signal.

14. The address output circuit of claim 12, wherein the first pulse signal generation unit comprises:

a latch section configured to generate a latch signal in response to the toggling signal and the reset signal; and a first pulse signal output section configured to receive the latch signal and output the first pulse signal in response to the toggling signal and the reset signal.

15. The address output circuit of claim 12, wherein the second pulse signal generation unit generates the second pulse signal by shifting the first pulse signal by one cycle of the toggling signal.

16. The address output circuit of claim 12, wherein the address output unit receives the first to fourth input addresses, and sequentially outputs the first to fourth output addresses in response to the toggling signal and the first and second pulse signals.

17. The address output circuit of claim 12, wherein the address output unit comprises:

an inverter configured to invert and buffer the toggling signal and generate an inverted toggling signal;

a first address output section configured to buffer the first input address and output the buffered first input address as the first output address in response to the toggling signal and the first pulse signal;

a second address output section configured to buffer the second input address and output the buffered second input address as the second output address in response to the inverted toggling signal and the first pulse signal;

a third address output section configured to buffer the third input address and output the buffered third input address as the third output address in response to the toggling signal and the second pulse signal; and a fourth address output section configured to buffer the fourth input address and output the buffered fourth input address as the fourth output address in response to the inverted toggling signal and the second pulse signal.

18. The address output circuit of claim 12, further comprising:

a toggling signal generation unit configured to generate the toggling signal in response to the test signal and the burst pulse signal; and a reset signal generation unit configured to generate the reset signal in response to the test signal and a power-up signal.

19. The address output circuit of claim 18, wherein the toggling signal generation unit comprises:

an inverter configured to invert and buffer the test signal and generate an inverted test signal;

a preliminary toggling signal generation section configured to generate a preliminary toggling signal in response to the inverted test signal and the burst pulse signal; and a buffer section configured to generate the toggling signal in response to the test signal and the preliminary toggling signal.

20. The address output circuit of claim 19, wherein the preliminary toggling signal generation section comprises:

a switching signal generation section configured to perform a logic operation on the inverted test signal and the burst pulse signal to generate a switching signal; and a preliminary toggling signal output section configured to receive the inverted test signal, and output the preliminary toggling signal in response to the switching signal.

* * * * *